United States Patent [19]
Ito et al.

[11] Patent Number: 5,502,629
[45] Date of Patent: Mar. 26, 1996

[54] DC-DC CONVERTER

[75] Inventors: Hidenobu Ito; Hiroko Mizuno, both of Kasugai, Japan

[73] Assignee: Fujitsu Limited, Japan

[21] Appl. No.: 412,112

[22] Filed: Mar. 28, 1995

[30] Foreign Application Priority Data

Mar. 31, 1994 [JP] Japan ................................ 6-087573

[51] Int. Cl.⁶ .................................................. H02M 3/18
[52] U.S. Cl. ............................ 363/60; 327/536; 307/110; 320/1
[58] Field of Search ..................... 363/59, 60; 327/530, 327/534, 535, 536; 307/110; 320/1; 323/266, 271

[56] References Cited

U.S. PATENT DOCUMENTS

| | | | |
|---|---|---|---|
| 5,051,881 | 9/1991 | Herold | 363/60 |
| 5,132,895 | 7/1992 | Kase | 363/60 |
| 5,159,543 | 10/1992 | Yamawaki | 363/60 |
| 5,245,524 | 9/1993 | Nakagawa et al. | 363/62 |
| 5,394,320 | 2/1995 | Blodgett | 363/60 |

*Primary Examiner*—Peter S. Wong
*Assistant Examiner*—Adolf Berhane
*Attorney, Agent, or Firm*—Staas & Halsey; James D. Halsey, Jr.

[57] ABSTRACT

A DC-DC converter includes first and second MOS transistors which selectively connect a first capacitor to a DC power supply so as to charge the first capacitor, and third and fourth MOS transistors which selectively connect the first capacitor to a second capacitor so as to charge the second capacitor by electric charges stored in the first capacitor. A predetermined output voltage is produced at a lead of the second capacitor serving as an output terminal, based on the charge/discharge operations of the first and second capacitors in response to the switching operations of the four MOS transistors. A variable voltage is applied to a back gate of one MOS transistor selected from the first to fourth MOS transistors. When the selected MOS transistor is on, a first control transistor in the converter forms a connection between a source and a back gate of the selected MOS transistor, to reduce the resistance value of the selected MOS transistor when turned on. When the selected MOS transistor is off, a second control transistor in the converter applies a voltage, selected from the predetermined output voltage and the supply voltages of the first and second DC power supplies, to the back gate of the selected MOS transistor. This prevents a parasitic bipolar transistor, inherently formed in the selected MOS transistor, from turning on.

15 Claims, 8 Drawing Sheets

Fig. 8
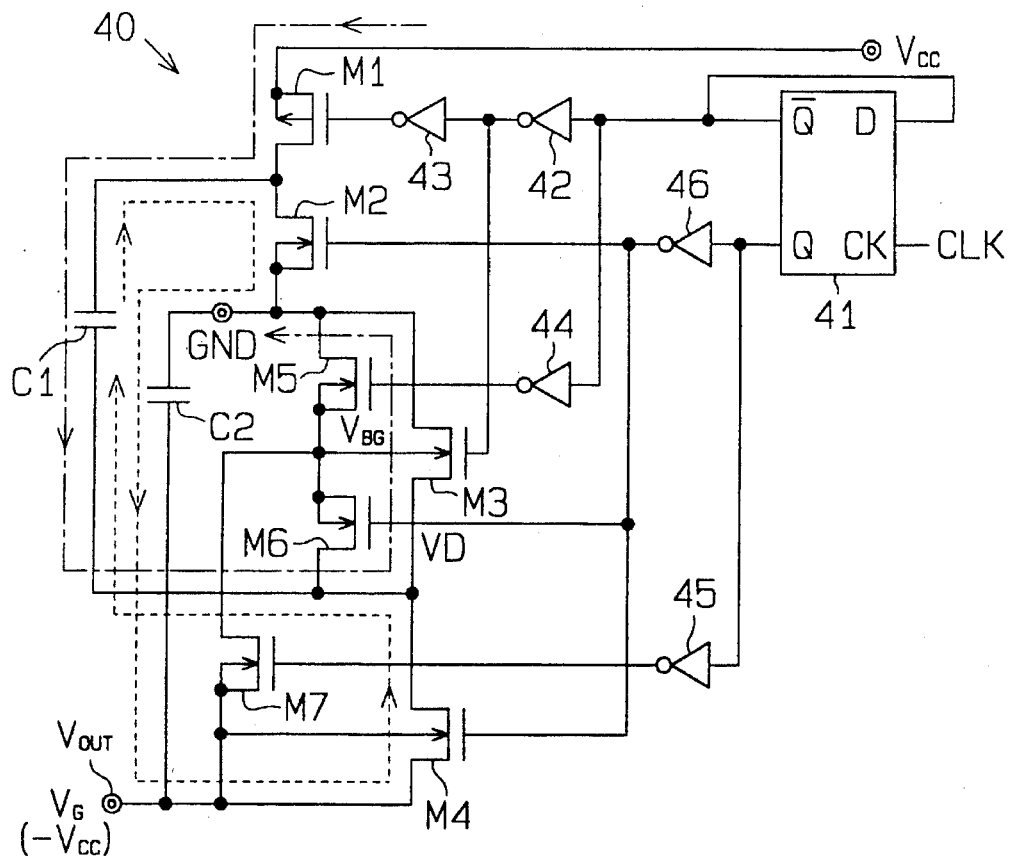
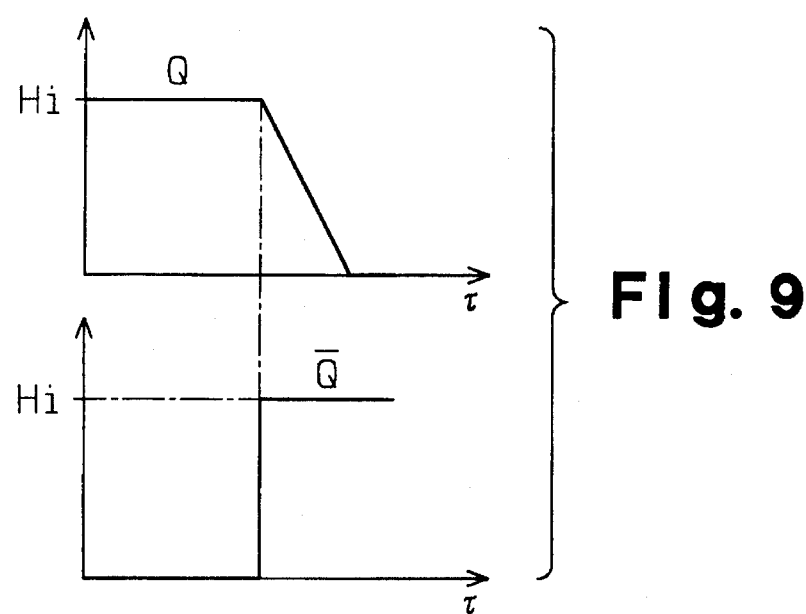
Fig. 9

DC-DC CONVERTER

BACKGROUND OF THE INVENTION

1. Field of the Invention

The present invention relates to a charge pump type DC-DC converter used in portable electronic devices. More particularly, the invention is directed to suppressing the operation of a parasitic bipolar transistor inherently formed in MOS transistor circuitry used for DC-DC power converters.

2. Description of the Related Art

Decreasing the power consumption rates of portable electronic devices such as cordless phones has been possible in part due to the lower supply voltage requirements of the semiconductor circuitry used in such devices. One type of circuit that makes low voltage information processing possible is a DC-DC converter. These types of converters are widely used to condition power supplied to a circuit from a source such as a battery.

FIG. 1 shows the circuit structure of a conventional charge pump type DC-DC converter 80 formed on a semiconductor chip. The DC-DC converter produces a negative voltage at the output terminal $V_{OUT}$. A P-channel MOS transistor M31 and three N-channel MOS transistors M32, M33 and M34 are connected in series between a high-potential power supply $V_{CC}$ and the output terminal $V_{OUT}$. The source of the transistor M31 is connected to the power supply $V_{CC}$ while its drain is connected to the drain of the transistor M32. The body of the transistor M31 (called "Back Gate") is connected to its own source. The transistor M32 has its source connected to the ground GND as a low-potential power supply, and its body connected to its own source. The transistor M33 has its source connected to the source of the transistor M32, and its drain connected to the source of the transistor M34. The transistor M34 has its drain connected to the output terminal $V_{OUT}$ and its body connected to its own drain. A first capacitor C11 is provided between the drain of the PMOS transistor M31 and the drain of the NMOS transistor M33. A second capacitor C12 is provided between the output terminal $V_{OUT}$ and the ground GND.

In the converter 80, when the transistors M31 and M33 are turned on and the transistors M32 and M34 are off, the capacitor C11 is electrically charged by the power supply $V_{CC}$. Conversely, when the transistors M31 and M33 are turned off and the transistors M32 and M34 are turned on, the capacitor C11 is discharged. Charge released from the first capacitor C11 is stored into the second capacitor C12. While the transistor pair (M31, M33) and the transistor pair (M32, M34) repeatedly cycle on and off, the converter 80 produces a prescribed voltage $V_G$ $(=-V_{CC})$ at the output terminal $V_{OUT}$.

N-channel MOS transistors M35 and M36 are connected in series between the source and drain of the transistor M33. The transistor M35 has its drain connected to the source of the transistor M33, and its source connected to the drain of the transistor M36. The source of the transistor M36 is connected to the drain of the transistor M33. The body of the transistor M33 is connected to the source of the transistor M35 and to the drain of the transistor M36.

A toggle flip-flop circuit (hereinafter referred to as TFF) 81 has a clock terminal CK that receives a clock signal CLK whose potential level periodically changes. The TFF 81 has a data terminal D and an inverted output terminal /Q which are connected to each other. The TFF 81 alternately outputs a H-level signal and a L-level signal from an output terminal Q every time it receives pulses of the clock signal CLK. The TFF 81 produces, at the inverted output terminal /Q, a signal whose phase is opposite to that of the output signal at the output terminal Q.

The output terminal Q of the TFF 81 is connected to the gates of the transistors M33 and M35, and to the gate of the transistor M31 via an inverter 82. The inverted output terminal /Q of the TFF 81 is connected to the gates of the transistors M32, M34 and M36. Consequently, all three transistors M31, M33 and M35 turn on or off approximately at the same time in response to the output signal from the output terminal Q. The three transistors M32, M34 and M36 are turned on or off approximately at the same time in response to the output signal from the inverted output terminal /Q. The transistors M32, M34 and M36 turn on and off upon the respective off and on action of the transistors M31, M33 and M35.

In the DC-DC converter 80, as described above, when a H-level signal is output from the output terminal Q and when a L-level signal is output from the inverted output terminal /Q in response to a pulse of the clock signal CLK, the three transistors M31, M33 and M35 turn on and the three transistors M32, M34 and M36 turn off. The first capacitor C11 is connected to the power supply $V_{CC}$ via the transistor M31, and to the ground GND via the transistor M33. Therefore, as indicated by a chain line, a current flows from the power supply $V_{CC}$ through the transistor M31, capacitor C11 and transistor T33, to charge the first capacitor C11. As a result, the first lead of the capacitor C11 connected to the transistor M31 reaches the same potential as the power supply $V_{CC}$, while the second lead connected to the transistor M33 is set to ground potential (i.e., zero volt).

Since the transistor M35 is turned on in that state, the body of the transistor M33 is grounded. No voltage difference exists between the source and body of the transistor M33, allowing the resistance of the transistor M33, when first turned on, to be fairly small. This results in high-speed charging of the first capacitor C11.

In response to another pulse of the clock signal CLK, the TFF 81 outputs an L-level signal at the output terminal Q and an H-level signal at the inverted output terminal /Q. In response, the three transistors M31, M33 and M35 turn off and the three transistors M32, M34 and M36 turn on. The first lead of the capacitor C11, having the potential of power supply $V_{CC}$, is then connected to the ground GND via the transistor M32. The second lead of the capacitor C11, set at ground, is then connected via the transistor M34 to the output terminal $V_{OUT}$ and to the second lead of the second capacitor C12 on the side of the output terminal $V_{OUT}$. Therefore, as indicated by a broken line, a current flows from the second capacitor C12 through the transistor M34, first capacitor C11 and transistor M32. The potential held by the first capacitor C11 is discharged to the second capacitor C12, causing the first lead of the second capacitor C12 to be grounded (i.e., zero volt) and the second lead to reach a potential equal to $-V_{CC}$. Since the transistor M34 is turned on, the voltage of $-V_{CC}$ is applied to the drain of the transistor M33.

When the transistor M36 is on, the body of the transistor M33 being coupled to the drain, is set to the drain potential. This allows the voltage of $-V_{CC}$ to be applied to the body of the transistor M33. In other words, the body and the drain of the transistor M33 are supplied with the same potential. This prevents a parasitic NPN transistor inherently formed in the transistor M33 from turning on.

FIG. 2 shows a sectional structure of the NMOS transistor M33 that is formed on a semiconductor chip. A P-type semiconductor substrate 84 has an N-type separation layer 85 formed therein. A P-type well (i.e., body or back gate) 86 is formed in the separation layer 85. An N-type drain region 87 and an N-type source region 88 are formed in the P-type well 86 separated by a predetermined interval. The substrate 84 is grounded. A voltage higher than the ground potential is applied to the separation layer 85 by means of a power supply 92. Therefore, when the transistor M33 is off, a reverse bias condition is established between the substrate 84 and the separation layer 85 and between the well 86 and the separation layer 85.

When the transistor M33 is off, a drain voltage $V_D$ of the transistor M33 is reduced by the transistor M34 from zero volt to the output voltage $V_G$ (i.e., $-V_{CC}$). At this time, the transistor M36 turns on to reduce a voltage $V_{BG}$ of the back gate of the transistor M33 to the output voltage $V_G$. However, since the source of the transistor M36 is connected to the drain of the transistor M33, the drain voltage $V_D$ and the body or channel voltage $V_{BG}$ change to the output voltage $V_G$, each with a characteristically different response as shown in FIG. 3. That is, voltages $V_O$ and $V_B$ change to the output voltage $V_G$ such that the body or channel voltage $V_{BG}$ is always higher than the drain voltage $V_D$.

If the semiconductor body voltage $V_{BG}$ and the drain voltage $V_D$ vary with the former being higher than the latter, a parasitic NPN bipolar transistor 89, composed of the separation layer 85 (collector), the P-type well 86 (base) and the drain region 87 (emitter), turns on. This parasitic effect causes a current to flow from the power supply 92 to the output terminal $V_{OUT}$ via the drain region 87 as the emitter of the bipolar transistor 89. As a result, the NMOS transistor 33 requires increased levels of power to operate.

Moreover, when the parasitic NPN transistor 89 turns on, a current flows through the separation layer 85 to cause a voltage drop at the collector area of the parasitic NPN transistor 89 due to the resistance 91 of the separation layer 85. This effectively turns on a parasitic PNP bipolar transistor 90 composed of the semiconductor substrate 84 (emitter), the separation layer 85 (base) and the P-type well 86 (collector), resulting in latch up and a decrease in conductivity.

SUMMARY OF THE INVENTION

Accordingly, it is a primary object of the present invention to provide a charge pump type DC-DC converter which suppresses the activation of a parasitic bipolar transistor inherent to the MOS transistor, in order to achieve decreased rates of power consumption.

To achieve the foregoing and other objects and in accordance with the purpose of the invention, an improved DC-DC converter is provided.

The DC-DC converter according to the present invention includes first and second capacitors and first to fourth MOS transistors. The second capacitor has a lead serving as an output terminal of the DC-DC converter. The first and second MOS transistors selectively connect the first capacitor to first and second DC power supplies so as to charge the first capacitor. The third and fourth MOS transistors selectively connect the first capacitor to the second capacitor so as to charge the second capacitor by electric charges stored in the first capacitor. A predetermined output voltage is produced at the output terminal of the DC-DC converter, based on the charge/discharge operations of the first and second capacitors by alternately turning on the first and second MOS transistors' pair and the third and fourth MOS transistors' pair. A variable voltage is applied to a back gate of one MOS transistor selected from the first to fourth MOS transistors, and constant voltages are applied to back gates of the other three MOS transistors.

The DC-DC converter further includes first and second control transistors. When the selected MOS transistor is on, the first control transistor forms a connection between a source and a back gate of the selected MOS transistor, to reduce the resistance value of the selected MOS transistor when turned on. When the selected MOS transistor is off, the second control transistor applies a voltage, selected from the predetermined output voltage and the supply voltages of the first and second DC power supplies, to the back gate of the selected MOS transistor. This prevents a parasitic bipolar transistor, inherently formed in the selected MOS transistor, from turning on.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 8 is a circuit diagram of a charge pump type DC-DC converter according to a second embodiment of the invention;

FIG. 9 shows waveforms of output signals from a TFF;

DETAILED DESCRIPTION OF THE PREFERRED EMBODIMENTS

FIRST EMBODIMENT

Figure 4:
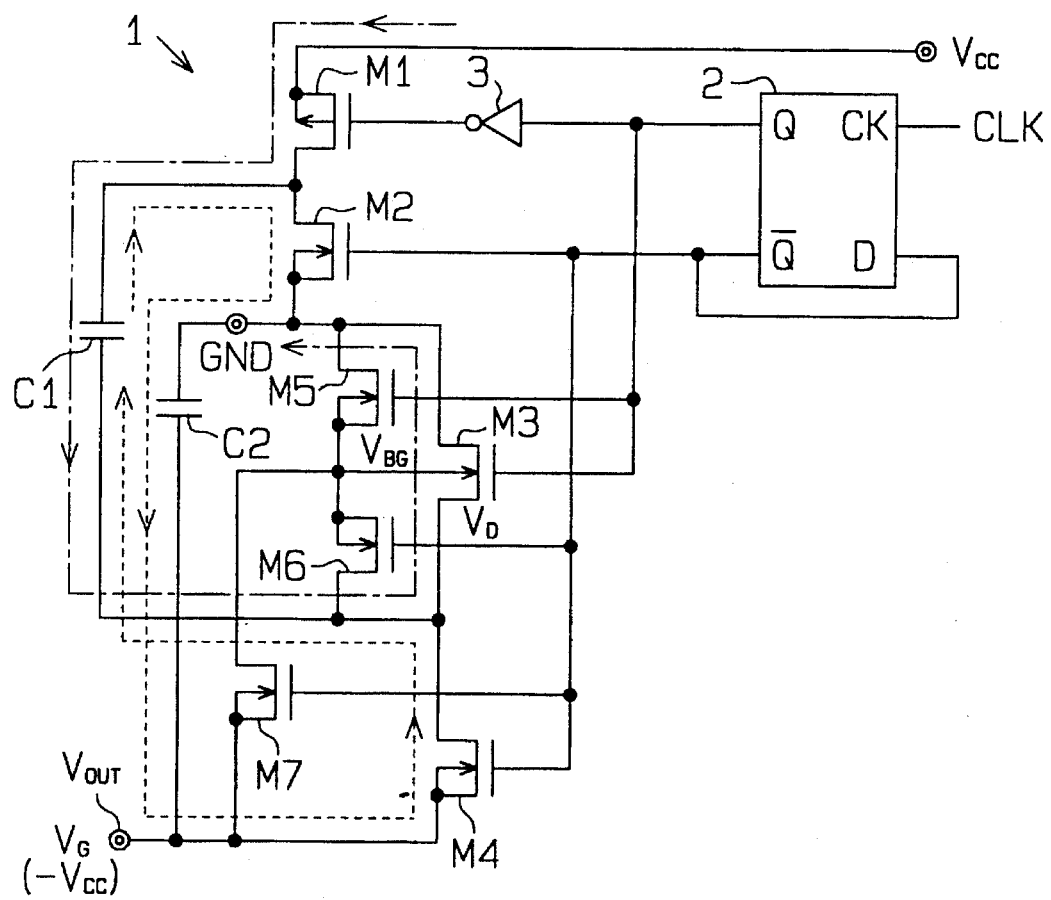
FIG. 4 is a circuit diagram of a charge pump type DC-DC converter according to a first embodiment of the present invention.

A first embodiment of the present invention will be described with reference to FIGS. 4 to 7. FIG. 4 is a circuit diagram showing a charge pump type DC-DC converter 1 according to this embodiment. The converter 1 produces a negative voltage at an output terminal $V_{OUT}$. A P-channel MOS transistor M1 and three N-channel MOS transistors M2, M3 and M4 are connected in series between a high potential power supply $V_{CC}$ as a first DC power supply and the output terminal $V_{OUT}$. The transistor M1 has its source connected to the power supply $V_{CC}$ and its drain connected to the drain of the transistor M2. The back gate of the transistor M1 (i.e., the body of M1) is connected to its source.

The transistor M2 has its source connected to a ground GND as a second DC power supply and its drain connected to the drain of the transistor M1. The back gate of the transistor M2 (i.e., the body of M2) is connected to its source. The drain of the transistor M3 is connected to the source of the transistor M4. The drain of the transistor M4 is connected to the output terminal $V_{OUT}$. The back gate of the transistor M4 (i.e., the body of M4) is connected to its drain.

Figure 5:
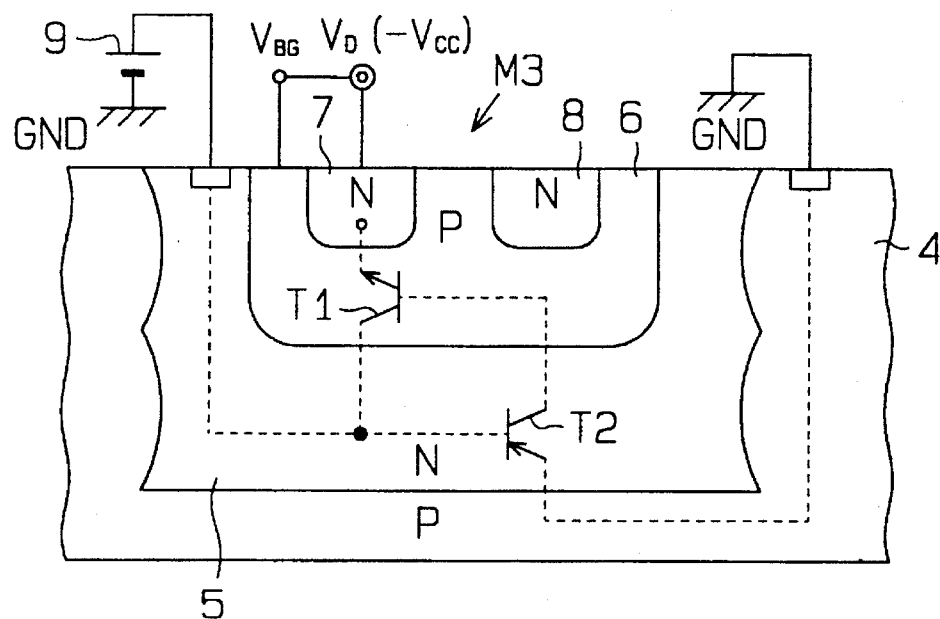
FIG. 5 is a sectional view showing a structure of an NMOS transistor used in the DC-DC converter of FIG. 4.

FIG. 5 shows a sectional structure of the NMOS transistor M3 that is formed on a semiconductor chip. An N-type separation layer 5 is formed in a P-type semiconductor layer 4. A P-type well (i.e., body or back gate) 6 is formed in the separation layer 5. A drain region 7 and a source region 8 are formed in the well 6 with a predetermined interval. The substrate 4 is grounded. A voltage higher than or equal to the ground potential is applied to the separation layer 5 by means of a power source 9. Thus, a reverse bias condition is established between the substrate 4 and the separation layer 5 and between the well 6 and the separation layer 5.

As shown in FIG. 4, the DC-DC converter 1 includes a first and second capacitors C1 and C2. The first capacitor C1 has a first lead connected to the drain of the transistor M1 and a second lead connected to the drain of the transistor M3. The second capacitor C2 includes a first lead connected to the ground GND and a second lead connected to the output terminal $V_{OUT}$.

In the converter 1, the first capacitor C1 is charged when the transistors M1 and M3 are on and the transistors M2 and M4 are off. That is, the capacitor C1 is charged such that its first lead is connected to the power supply $V_{CC}$ via the transistor M1 and its second lead is connected to the ground GND via the transistor M3. When the transistors M1 and M3 are off and the transistors M2 and M4 are on, the first capacitor C1 is discharged whereas the capacitor C2 is charged. While the two transistors M1 and M3 and the two transistors M2 and M4 repeatedly cycle on and off, the converter 1 produces an output voltage $V_G$ ($V_G=-V_{CC}$) at the output terminal $V_{OUT}$.

N-channel MOS transistors M5 and M7 as first and second control MOS transistors are connected in series between the source of the transistor M3 and the drain of the transistor M4. The transistor M5 has its drain connected to the source of the transistor M3 and its source connected to the drain of the transistor M7. The source of the transistor M7 is connected to the drain of the transistor M4 and to the output terminal $V_{OUT}$.

The source of the transistor M5 and the drain of the transistor M7 are connected to the back gate (i.e., well 6) of the transistor M3. The transistor M5 connects the back gate of the transistor M3 to the ground GND while the transistor M3 is turned on. As a result, no voltage difference exists between the source and back gate of the transistor M3, so that the resistance of the transistor M3 when turned on is reduced.

While the transistor M3 is off, the transistor M7 connects the back gate of the transistor M3 to the output terminal $V_{OUT}$, thereby applying the output voltage $V_G$ ($=-V_{CC}$) to the back gate of the transistor M3. Thus, the potentials of the well 6 and the drain region 7 of the transistor M3 are set equal to each other, in order to prevent a parasitic NPN transistor T1 in the transistor M3 from turning on.

An N-channel MOS transistor M6 as a third control MOS transistor is provided between the back gate and the drain of the transistor M3. The resistance value of the transistor M6 when turned on is set smaller than the resistance value of the transistor M7 when turned on. While the transistor M3 is off steadily, the transistor M6 prevents the parasitic NPN transistor T1 in the transistor M3 from being turned on. Specifically, when the transistor M3 is turned off and fixed to the off state, the drain voltage $V_D$ of the transistor M3 is $-V_{CC}$ and the output voltage $V_G$ at the output terminal $V_{OUT}$ is somewhat higher than $-V_{CC}$. In other words, the output voltage $V_G$ is higher than the drain voltage $V_D$ ($V_D<V_G$). In this state, the voltage between the output voltage $V_G$ and the drain voltage $V_D$ is divided by the transistor M6 and M7. This causes the back gate voltage $V_{BG}$ of the transistor M3 to approach the drain voltage $V_D$. As a result, the back gate voltage $V_{BG}$ of the transistor M3 becomes equal to the drain voltage $V_D$, so that the parasitic transistor T1 in the transistor M3 is prevented from being turned on.

The DC-DC converter 1 includes a toggle flip-flop circuit (hereinafter referred to as TFF) 2 which receives a clock signal CLK having a predetermined period at an clock terminal CK. The TFF 2 has an output terminal Q, an inverted output terminal /Q and a data terminal D connected to the terminal /Q. Every time the TFF 2 receives pulses of the clock signal CLK, it alternately outputs a H-level signal and a L-level signal from the output terminal Q. Further, the TFF 2 outputs, from the inverted output terminal /Q, a signal whose phase is opposite to that of the output signal from the output terminal Q.

The output terminal Q of the TFF 2 is connected not only to the gates of the transistors M3 and M5, but also to the gate of the transistor M1 via an inverter 3. The inverted output terminal /Q of the TFF 2 is connected to the gates of the transistors M2, M4, M6 and M7. Therefore, the three transistors M1, M3 and M5 are turned on or off approximately at the same time in response to the output signal sent from the output terminal Q. The four transistors M2, M4, M6 and M7 are turned on or off approximately at the same time in response to the output signal sent from the inverted output terminal /Q. The four transistors M2, M4, M6 and M7 are on when the three transistors M1, M3 and M5 are off, and are off when the three transistors M1, M3 and M5 are on.

In the DC-DC converter 1 having the above configuration, when the TFF 2 outputs a H-level signal from the terminal Q and a L-level signal from the terminal /Q in response to a pulse of the clock signal CLK, the three transistors M1, M3 and M5 are turned on and the four transistors M2, M4, M6 and M7 are turned off. Accordingly, the first lead of the capacitor C1 is connected to the power supply $V_{CC}$ via the transistor M1, and the second lead of the capacitor C1 is connected to the ground GND via the transistor M3. Therefore, as indicated in FIG. 4 by a chain line, a current flows from the power supply $V_{CC}$ to the ground GND through the transistor M1, the capacitor C1 and the transistor M3, to charge up the capacitor C1. As a result, the first lead of the capacitor C1 has the same potential as the power supply $V_{CC}$, and the second lead thereof has the same potential as the ground level (i.e., zero volt).

Since the transistor M5 is on, the back gate of the transistor M3 is connected to the ground GND. As a result, no voltage difference exists between the source and the back gate of the transistor M3, and, therefore, the resistance value of the transistor M3 when turned on is reduced. This results in high-speed charging of the capacitor C1.

In response to another pulse of the clock signal CLK, an L-level signal is output from the output terminal Q of the TFF 2 and an H-level signal is output from the output terminal /Q. Then, the three transistors M1, M3 and M5 turn off and the four transistors M2, M4, M6 and M7 turn on.

The first lead of the first capacitor C1, having the same potential as the power supply $V_{CC}$, is now connected to the ground GND via the transistor M2. The second lead of the first capacitor C1 is connected via the transistor M4 to the second lead of the second capacitor C2 and the output terminal $V_{OUT}$. Therefore, as indicated by a broken line, a current flows from the second capacitor C2, through the transistor M4, capacitor C1 and transistor M2, to the ground GND. Thus, the first capacitor C1 is discharged and the second capacitor C2 is charged. As a result, the first lead of the capacitor C2 has the same potential as the ground level (i.e., zero volt) and the second lead thereof has a potential equal to $-V_{CC}$. Since the transistor M4 is on, the drain voltage $V_D$ of the transistor M3 is reduced to the output voltage $V_G$ ($=-V_{CC}$). Further, since the transistors M6 and M7 are on, the back gate of the transistor M3 is connected to the output terminal $V_{OUT}$ and supplied with the output voltage $V_G$. As a result, the back gate voltage $V_{BG}$ and the drain voltage $V_D$ of the transistor M3 become equal to each other, thereby preventing the parasitic NPN transistor T1 inherently formed in the transistor M3 from turning on.

Figure 6:
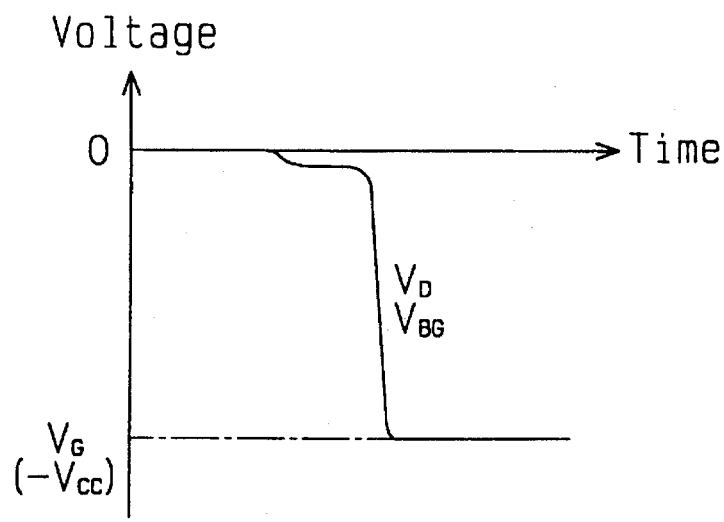
FIG. 6 is a graph showing how a drain voltage and a back gate voltage vary when the NMOS transistor of FIG. 5 is turned off.

FIG. 6 shows how the drain voltage $V_D$ and the back gate voltage $V_{BG}$ of the transistor M3 vary when the transistor M3 is turned off. When the transistor M3 is turned off, the drain voltage $V_D$ is reduced to the output voltage $V_G$ ($=-V_{CC}$) due to the turning on of the transistor M4. Then, the back gate voltage $V_{BG}$ of the transistor M3 is directly reduced to the output voltage $V_G$ ($=-V_{CC}$) due to the turning on of the transistor M7. Therefore, the drain voltage $V_D$ and the back gate voltage $V_{BG}$ drop to the output voltage $V_G$ approximately at the same time. Accordingly, the parasitic transistor T1, which is inherently formed in the transistor M3 and is composed of the separation layer 5 (collector), well 6 (base) and drain region 7 (emitter), is not turned on. Thus, no current flows from the power supply 9 to the output terminal $V_{OUT}$. Further, since the parasitic NPN transistor T1 is not turned on, a parasitic PNP transistor T2, composed of the substrate 4 (emitter), separation layer 5 (base) and well 6 (collector), is not turned on, thereby preventing latch up.

As described above, the DC-DC converter 1 of this embodiment prevents the parasitic bipolar transistors T1 and T2 from turning on and prevents the transistor M3 from being latched up, while the transistor M3 is off which transistor serves to charge up the capacitor C1. This reduces the power consumption of the DC-DC converter 1.

Figure 7:
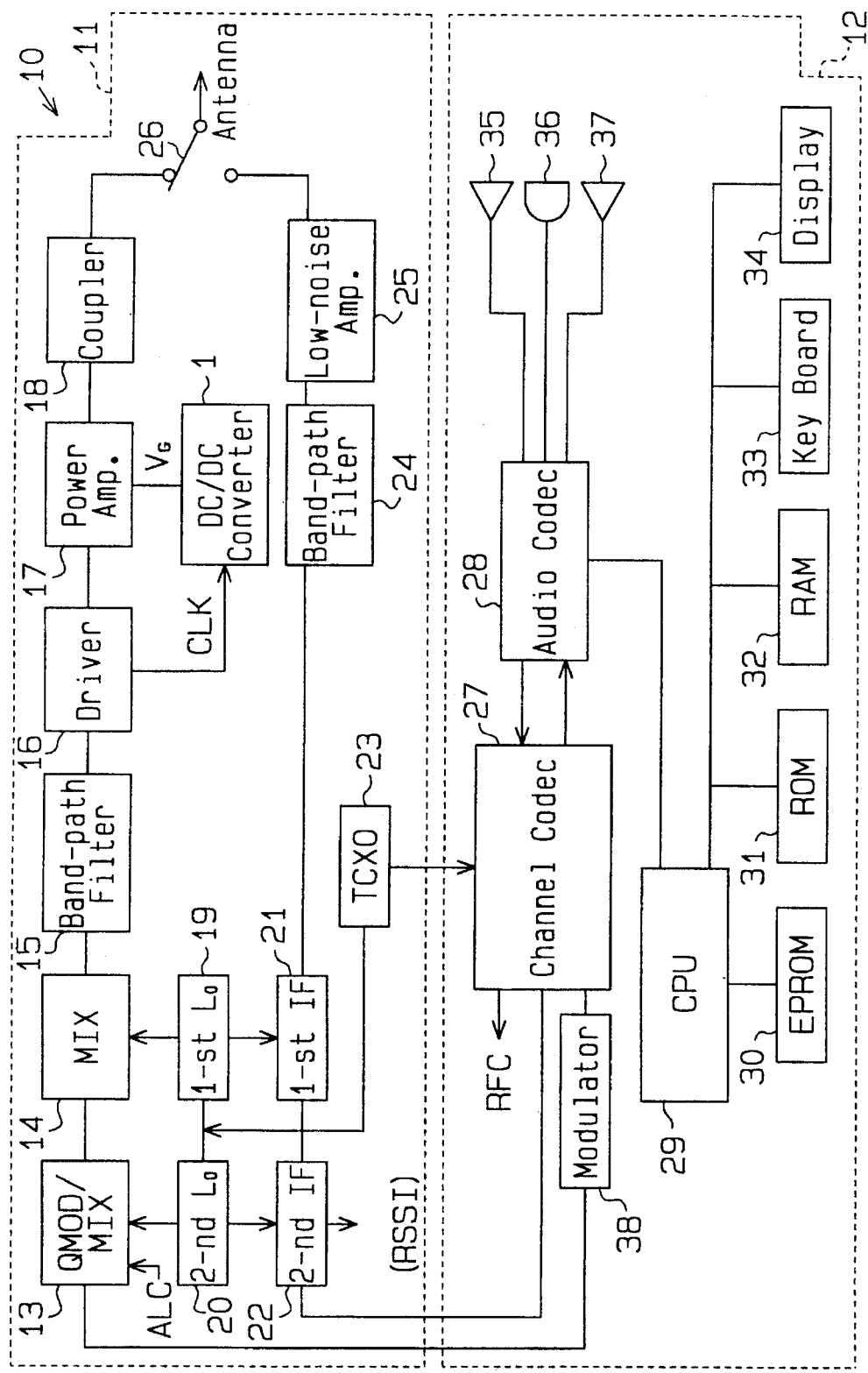
FIG. 7 is a block diagram showing an electrical circuit of a communication terminal using the DC-DC converter of FIG. 4.

FIG. 7 is a block diagram showing an electrical circuit of a movable communication terminal 10 using the DC-DC converter 1 according to this embodiment. The terminal 10 includes a radio section 11 and a control section 12.

The control section 12 has a 16-bit central processing unit (CPU) 29 to perform system control, telephone application control, key input control and display control. The CPU 29 is connected to a ROM 31 and a RAM 32 via a bus. The ROM 31 stores control commands or programs for the CPU 29. The RAM 32 stores data concerning an operation state of the communication terminal 10. The CPU 29 also couples to an EPROM 30, a key board 33 and a display device 34.

A channel codec 27 performs time-division multiple access (TDMA) processing/time-division duplex (TDD) processing, sync acquisition control, detection of unique words, CRC error detection, π/4-shift QPSK demodulation (DEM) with the input of a second IF signal (10-MHz band), and radio frequency timing control (RFC). The channel codec 27 further performs the setting of frequencies of a RF section (not shown) to a first PLL and a second PLL, transmission power control by using ALC, level detection of Received Signal Strength Indicator (RSSI), and control of a power supply of the RF section.

A modulator 38 converts transmission data supplied from the channel codec 27, which performs π/4-shift QPSK modulation, to an I/Q (bar I/bar Q) signal. An audio codec 28 performs coding and decoding on an analog audio signal and an ADPCM digital signal of 32 kbps, control of input from a microphone 36, control of output to a receiver 35, and control of output to a buzzer 37. Adjustment of receiving sound volume, turning on/off of the buzzer 37, and audio mute processing at the occurrence of an error in received data are controlled by the CPU 29.

The entire system of the radio section 11 is synchronized using an oscillation signal of 19.2 MHz, as a reference signal, output from a temperature-compensated quartz oscillator (TCXO) 23. The oscillation signal of the TCXO 23 is supplied to a first LO oscillator 19 and a second LO oscillator 20. The oscillation signal of the TCXO 23 is also supplied to the control section 12. The frequency of the oscillation signal is divided by the channel codec 27, and is supplied to the modulator 38, the audio codec 28 and the CPU 29.

The first LO oscillator 19 operates in a 1.6-GHz band, and supplies an output signal to a transmission mixer unit (MIX) 14 and to a mixer unit provided in a first IF unit 21. The second LO oscillator 20 operates in a 200-MHz band, and supplies an output signal to a transmission quadrature modulation/mixer (QMOD/MIX) unit 13 and to a mixer unit provided in a second IF unit 22. Specifically, the I/Q (bar I/bar Q) signal from the modulator 38 is subjected to quadrature modulation (QMOD) in the 200-MHz band by the quadrature modulation/mixer unit 13, and then converted to a signal of the 1.6-GHz band by the mixer unit (MIX) 14.

An output signal of the mixer circuit 14 is processed in a band-pass filter 15 and a driver 16, and then supplied via a power amplifier 17, a coupler 18 and a changeover switch 26 to an antenna. The transmission power is controlled being detected through the coupler 18. The driver 17 supplies a clock signal CLK to the DC-DC converter 1. The DC-DC converter 1 applies an output voltage $V_G$ to the power amplifier 17. The power amplifier 17 is formed by a GaAs semiconductor integrated circuit device, and is driven by the negative output voltage $V_G$ ($=-V_{CC}$).

A receiving signal is input from the antenna through the switch 26. The receiving signal is then processed by a low-noise amplifier 25 and a bandpass filter 24, and input to the first IF unit 21. The first IF unit 21 subjects the receiving signal to frequency-conversion, so that the signal is converted to a signal of the 200-MHz band. The converted signal is further processed by a filter of the first IF unit 21, and then amplified. The second IF unit 22 subjects the output signal from the first IF unit 21 to frequency-conversion, so that the signal is converted to a signal of 10-MHz band. The converted signal is further processed by a filter of the second IF unit 22, and then amplified. The amplified signal is output to the channel codec 27. The output signal from the second IF unit 22 is also used to detect a RSSI.

SECOND EMBODIMENT

A second embodiment of the present invention will be described with reference to FIGS. 8, 9 and 10. FIG. 8 is a circuit diagram of a charge pump type DC-DC converter 40. In this embodiment, the same components as in FIG. 4 are given the same reference numerals in FIG. 8 and detailed descriptions therefor will be omitted.

The DC-DC converter 40 has an output terminal $V_{OUT}$ to produce a negative voltage. Like the converter 1 of FIG. 4, a first capacitor C1 in the converter 40 is charged up while three transistors M1, M3 and M5 are on and four transistors M2, M4, M6 and M7 are off, and a second capacitor C2 is charged up while the three transistors M1, M3 and M5 are off and the four transistors M2, M4, M6 and M7 are on. Therefore, while the three transistors M1, M3 and M5 and the four transistors M2, M4, M6 and M7 are alternately and repeatedly turned on, the converter 40 produces a prescribed output voltage (i.e., $-V_{CC}$ volt) at the output terminal $V_{OUT}$.

A TFF 41 alternately outputs a H-level signal and a L-level signal from an output terminal Q in response to a clock signal CLK of a predetermined period, and also outputs, at an inverted output terminal /Q, a signal whose phase is opposite to that of the output signal from the output terminal Q. As shown in FIG. 9, the TFF 41 produces the output signals Q and /Q with an inclined falling edge and a steep rising edge.

The output terminal /Q is connected to the gate of the transistor M1 via two inverters 42 and 43. The gate of the transistor M3 is connected to the output terminal /Q via the inverter 42. The gate of the transistor M5 is connected to the output terminal /Q via the inverter 44. The output terminal Q is connected to the gates of the three transistors M2, M4 and M6 via an inverter 46. The gate of the transistor M7 is connected to the output terminal Q via an inverter 45. Each of the five inverters 42, 43, 44, 45 and 46 is a CMOS inverter composed of a pair of P-channel and N-channel MOS transistors. The ratio between the sizes of the PMOS transistor and the NMOS transistor depends on the respective inverters 42 to 46. In general, as the size of the PMOS transistor becomes larger than the size of the NMOS transistor, each inverter has a threshold operating potential closer to an H-level. As the size of the PMOS transistor becomes smaller than the size of the NMOS transistor, each inverter has a threshold operating potential closer to an L-level. In this embodiment, the inverters 42, 43, 44, 45 and 46 have ratios of the size of the PMOS transistor to that of the NMOS transistor of 1:1, 15:1, 1:6, 6:1, and 1:2, respectively.

In the DC-DC converter 40, when an L-level signal is output from the output terminal Q of the TFF 41 and an H-level signal is output from the inverted output terminal /Q, the condition of turning off the transistor M3 is satisfied. Because of the above size ratios of the respective inverters 42–46, the transistor M3 turns off first, and the transistor M7 turns on next. Then, the transistors M4 and M6 turn on in this order.

Figure 10:
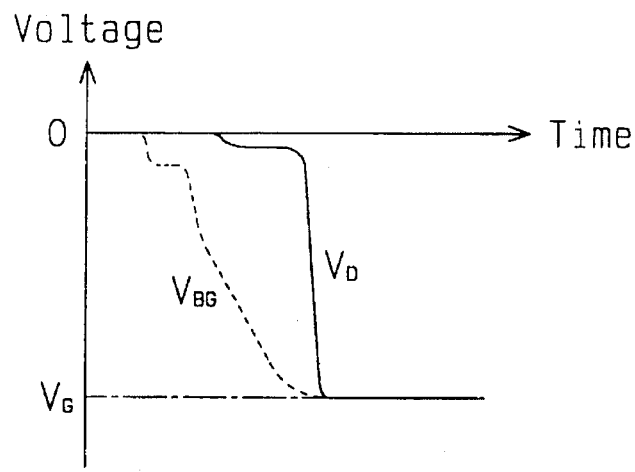
FIG. 10 is a graph showing how a drain voltage and a back gate voltage vary when an NMOS transistor is turned off.

Consequently, as shown in FIG. 10, the back gate voltage $V_{BG}$ of the transistor M3 is reduced to the output voltage $V_G$ (i.e., $-V_{CC}$ volt) somewhat earlier than the drain voltage $V_D$ thereof. As a result, in approaching the output voltage $V_G$, the back gate voltage $V_{BG}$ is lower than the drain voltage $V_D$. Even if the transistors M4 and M6 have a difference in ability, therefore, a parasitic bipolar transistor inherently formed in the transistor M3 is positively prevented from being turned on. Thus, in the converter 40, the transistor M3 is prevented from being latched up, thereby reducing the power consumption.

THIRD EMBODIMENT

Figure 11:
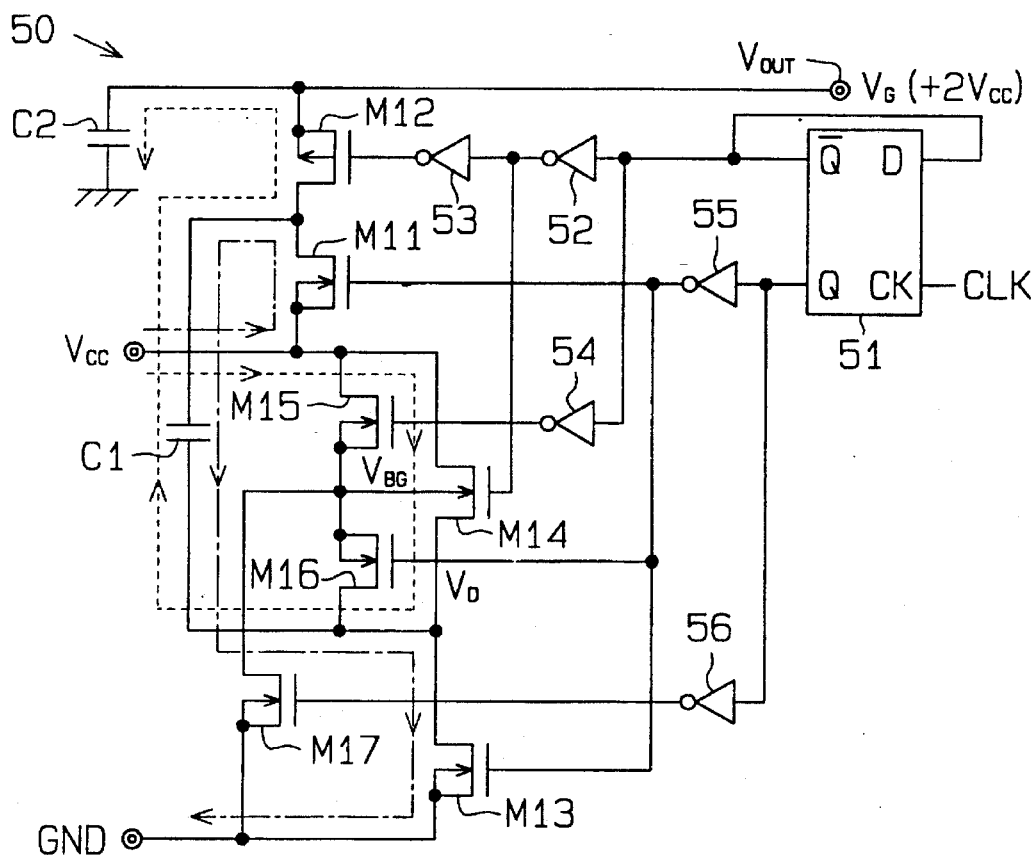
FIG. 11 is a circuit diagram of a charge pump type DC-DC converter according to a third embodiment of the invention.

A third embodiment of the invention will be described with reference to FIG. 11. FIG. 11 is a circuit diagram of a charge pump type DC-DC converter 50. In FIG. 11, the components as in FIG. 4 are given the same reference numerals and detailed descriptions therefor will be omitted.

The DC-DC converter 50 has an output terminal $V_{OUT}$ at which a positive voltage is produced. In response to a clock signal CLK having a predetermined period, a TFF 51 alternately outputs an H-level signal and an L-level signal from an output terminal Q thereof. A signal, whose phase is opposite to that of the output signal from the output terminal Q, is output from an inverted output terminal /Q of the TFF 51.

The output terminal /Q of the TFF 51 is connected to the gate of a PMOS transistor M12 via two inverters 52 and 53. The gate of an NMOS transistor M14 is connected to the output terminal /Q via the inverter 52. The output terminal /Q of the TFF 51 is connected via an inverter 54 to the gate of an NMOS transistor M15 as a first control MOS transistor. The output terminal Q is connected via an inverter 55 to the gates of an NMOS transistor M11, an NMOS transistor M16 as a control MOS transistor when activated, and an NMOS transistor M13. The gate of an NMOS transistor M17 as a second control MOS transistor is connected to the output terminal Q via an inverter 56.

In the DC-DC converter 50, when an L-level signal is output from the output terminal Q of the TFF 51 and an H-level signal is output from the output terminal /Q in response to a pulse of the clock signal CLK, the four transistors M11, M13, M16 and M17 turn on and the three transistors M12, M14 and M15 turn off.

A first capacitor C1 has a first lead connected to a power supply $V_{CC}$ via the transistor M11, and a second lead connected to the ground GND via the transistor M13. As indicated by a chain line, a current flows from the power supply $V_{CC}$ to the ground GND through the transistor M11, capacitor C1, and transistor M13, to charge up the capacitor C1. As a result, the first lead of the capacitor C1 has the same potential as the power supply $V_{CC}$, and the second lead has the same potential as the ground level (i.e., zero volt).

When the transistors M16 and M17 are on, the body or back gate of the transistor M14 is connected to the ground GND via the transistor M17, to be supplied with the ground level potential. As a result, the voltage $V_{BG}$ of the P-type back gate and the voltage $V_D$ of the N-type drain in the transistor M14 become equal to each other, so that a parasitic bipolar transistor inherently formed in the transistor M14 is prevented from being turned on. Specifically, when the transistor M14 is turned off, the drain voltage $V_D$ of the transistor M14 is reduced to the ground level potential by turning on the transistor M13. At this time, the back gate voltage $V_{BG}$ of the transistor M14 is reduced to the ground level potential due to the turning on of the transistor M17. Therefore, the drain voltage $V_D$ and the back gate voltage $V_{BG}$ are reduced to the ground level potential approximately at the same time.

When an H-level signal is output from the output terminal Q of the TFF 51 and an L-level signal is output from the output terminal /Q in response to another pulse of the clock signal CLK, the four transistors M11, M13, M16 and M17 turn off and the three transistors M12, M14 and M15 turn on. The second lead of the first capacitor C1 is connected to the power supply $V_{CC}$ via the transistor M14. The first lead of the capacitor C1 is connected via the transistor M12 to the first lead of a second capacitor C2 and the output terminal $V_{OUT}$. Accordingly, as indicated by a broken line, a current flows from the power supply $V_{CC}$ to the ground GND through the transistor M14, first capacitor C1, transistor M12 and second capacitor C2. This results in discharging the first capacitor C1 and charging the second capacitor C2. As a result, the first lead of the second capacitor C2 has a potential that is twice the potential of the power supply $V_{CC}$, and the second lead of C2 has the ground level potential (i.e., zero volt).

Under this condition, the transistor M15 is on, and therefore no potential difference exists between the source and the back gate of the transistor M14. This allows the resistance value of the transistor M14, when turned on, to be small. Accordingly, the charge transfer from the first capacitor C1 to the second capacitor C2 is performed at high speed.

According to the DC-DC converter 50 of this embodiment, when the transistor M14 is turned off, the voltage $V_{BG}$ of the P-type back gate and the voltage $V_D$ of the N-type drain in the transistor M14 are made equal to each other, so that the parasitic bipolar transistor inherently formed in the transistor M14 is prevented from being turned on. Therefore, the transistor M14 is prevented from being latched up, thereby reducing the power consumption.

FOURTH EMBODIMENT

Figure 12:
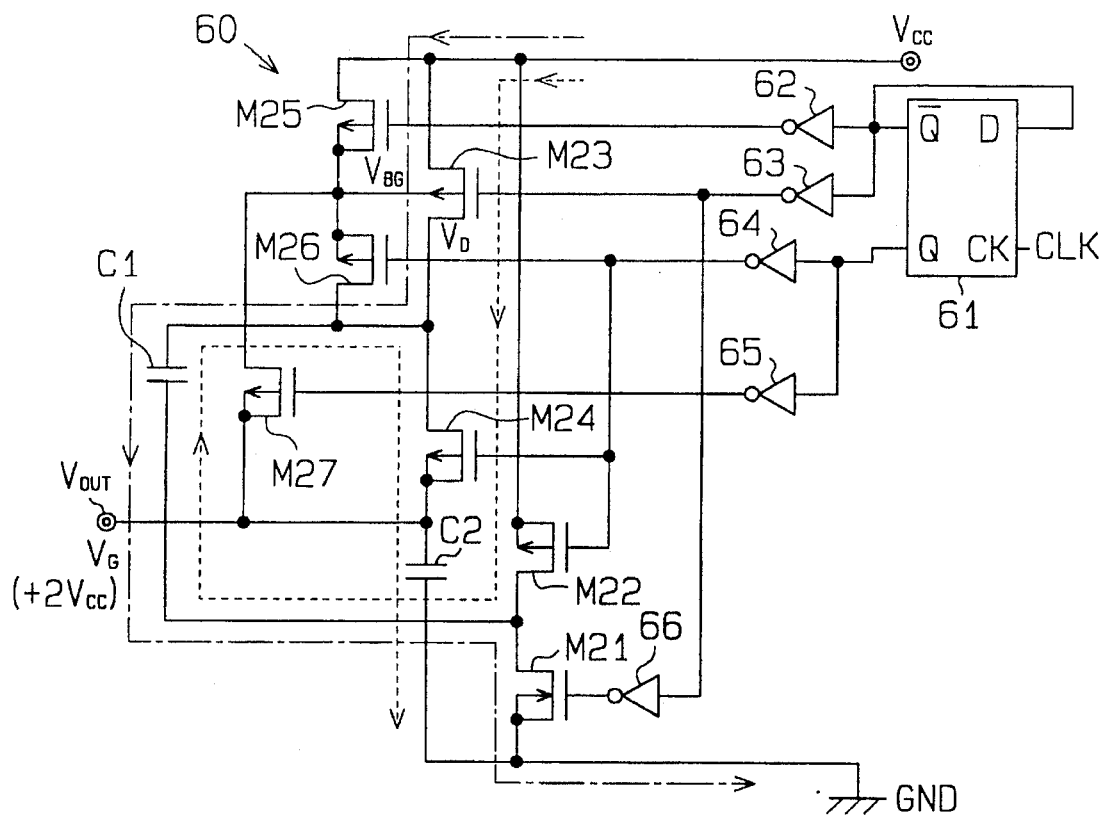
FIG. 12 is a circuit diagram of a charge pump type DC-DC converter according to a fourth embodiment of the invention.
Figure 13:
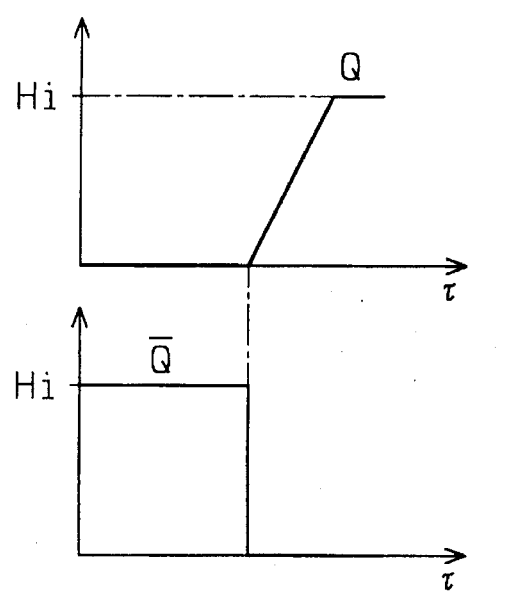
FIG. 13 shows waveforms of output signals from a TFF.

A fourth embodiment of the invention will be described with reference to FIGS. 12 to 14. FIG. 12 is a circuit diagram of a charge pump type DC-DC converter 60 according to this embodiment.

The DC-DC converter 60 has an output terminal $V_{OUT}$ at which a positive voltage is produced. An NMOS transistor M21 and a PMOS transistor M22 are connected in series between the ground GND and a power supply $V_{CC}$. The transistor M21 has its source connected to the ground GND, and its drain connected to the drain of the transistor M22. The transistor M22 has its source connected to the power supply $V_{CC}$ and its body or back gate connected to its own source.

A PMOS transistor M23 and a PMOS transistor M24 are connected in series between the power supply $V_{CC}$ and the output terminal $V_{OUT}$. The transistor M23 has its source connected to the power supply $V_{CC}$ and its drain connected to the source of the transistor M24. The transistor M24 has its drain connected to the output terminal $V_{OUT}$ and its body or back gate connected to its own drain.

Figure 1:
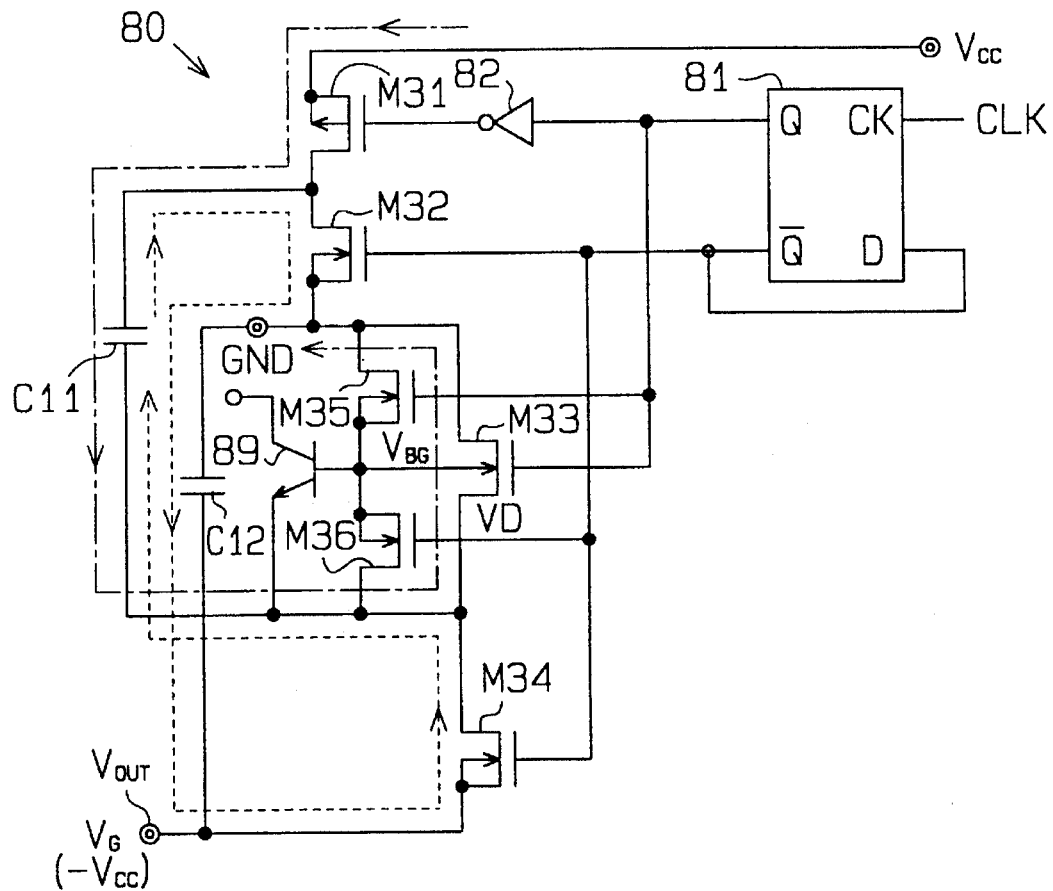
FIG. 1 is a circuit diagram of a conventional charge pump type DC-DC converter.
Figure 14:
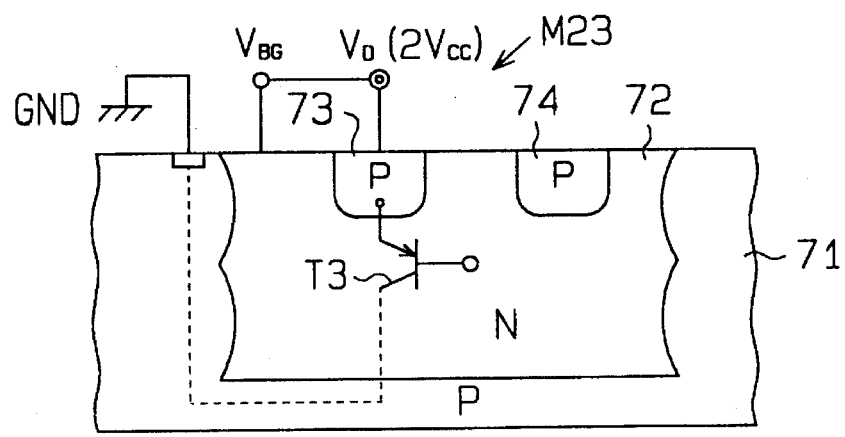
FIG. 14 is a sectional view showing a structure of an PMOS transistor used in the DC-DC converter of FIG. 12.
Figure 2:
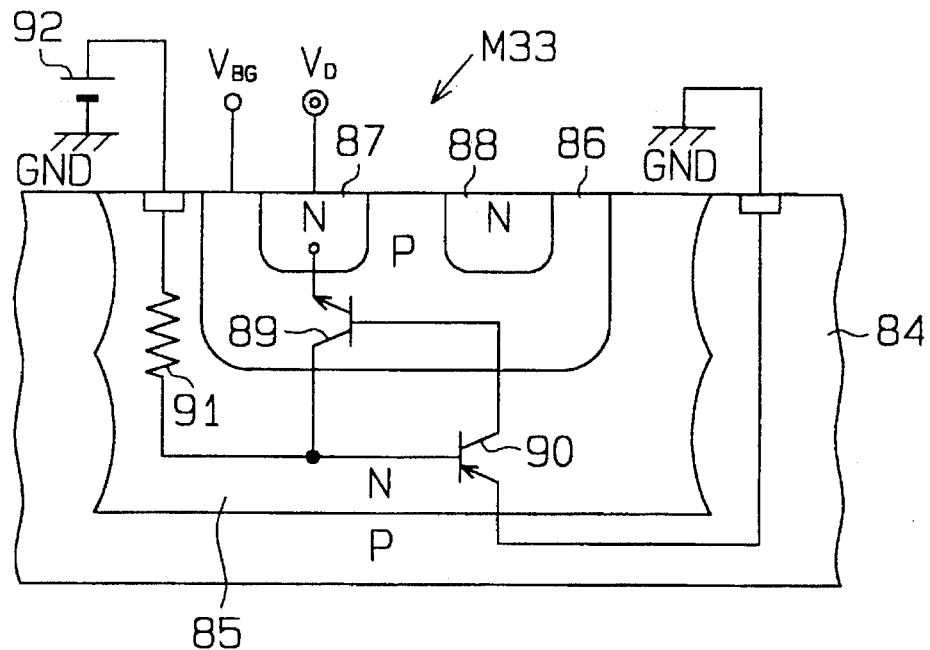
FIG. 2 is a sectional view showing a structure of an NMOS transistor used in the converter of FIG. 1.
Figure 3:
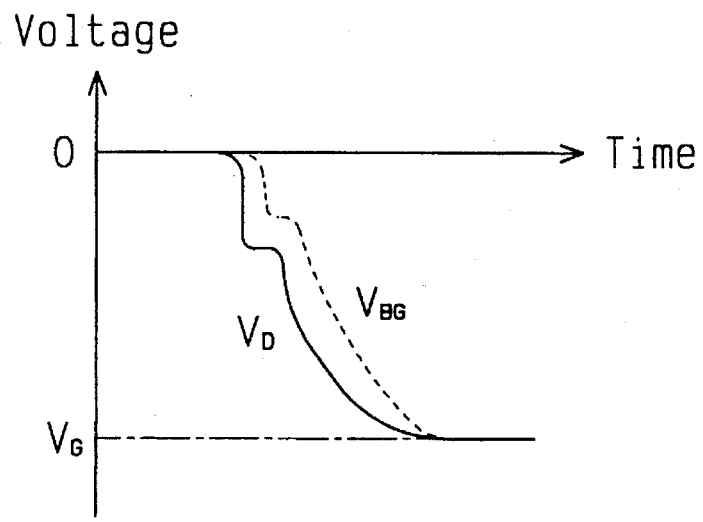
FIG. 3 is a graph showing how a drain voltage and a back gate voltage vary when the NMOS transistor is turned off.

FIG. 14 shows a sectional structure of the PMOS transistor M23 formed on a semiconductor chip. An N-type well (i.e., back gate) 72 is formed in a P-type semiconductor substrate 71. A P-type drain region 73 and a P-type source region 74 are formed with a predetermined interval in the well 72. The substrate 71 is grounded.

Referring to FIG. 12, a first capacitor C1 is provided between the transistors M21 and M23. A second capacitor C2 is provided between the output terminal $V_{OUT}$ and the ground GND. In the converter 60, the first capacitor C1 is charged up when the two transistors M21 and M23 are on and the two transistors M22 and M24 are off. When the two transistors M21 and M23 turn off and the two transistors M22 and M24 turn on, the first capacitor C1 is discharged and the second capacitor C2 is charged by charges released from the capacitor C1. The two transistors M21 and M23 and the two transistors M22 and M24 are alternately and repeatedly turned on, so that the converter 60 produces an output voltage $V_G$ ($V_G = +2V_{CC}$) at the output terminal $V_{OUT}$.

PMOS transistors M25 and M27 as first and second control MOS transistors are connected in series between the source of the transistor M23 and the drain of the transistor M24. The transistor M25 has its drain connected to the source of the transistor M23 and its source connected to the drain of the transistor M27. The source of the transistor M27 is connected to the drain of the transistor M24 and to the output terminal $V_{OUT}$. The source of the transistor M25 and the drain of the transistor M27 are connected to the back gate (i.e., N-type well 72) of the transistor M23.

The transistor M25 connects the back gate of the transistor M23 to the power supply $V_{CC}$ when the transistor M23 is on. When the back gate is connected to the power supply $V_{CC}$, no potential difference exists between the source and back gate of the transistor M23. This reduces the resistance value of the transistor M23 when turned on.

The transistor M27 connects the back gate of the transistor M23 to the output terminal $V_{OUT}$ when the transistor M23 is off. When the back gate of the transistor M23 is connected to the output terminal $V_{OUT}$, the back gate is supplied with the output voltage $V_G$ ($=+2V_{CC}$). As a result, a back gate voltage $V_{BG}$ and a drain voltage $V_D$ of the transistor M23 become equal to each other, thereby preventing a parasitic bipolar PNP transistor inherently formed in the transistor M23 from being turned on. A PMOS transistor M26 as a third control transistor is provided between the back gate and the drain of the transistor M23. The resistance value of the transistor M26 when turned on is set smaller than that of the transistor M27 when turned on. When the transistor M23 is turned off and fixed to the off state, the transistors M26 and M27 divide the voltage between the output voltage $V_G$ and the drain voltage $V_D$ of the transistor M23. Then, the back gate voltage $V_{BG}$ of the transistor M23 approaches the drain voltage $V_D$. Even when the transistor M26 is steadily off, therefore, the back gate voltage $V_{BG}$ and the drain voltage $V_D$ of the transistor M23 are made equal to each other, so that the parasitic bipolar PNP transistor inherently formed in the transistor M23 is prevented from being turned on.

In response to a clock signal CLK of a predetermined period, a TFF 61 alternately outputs an H-level signal and an L-level signal from an output terminal Q, and also outputs, from an inverted output terminal /Q, a signal whose phase is opposite to that of the output signal of the terminal Q. As shown in FIG. 13, the TFF 61 produces the output signals with an inclined rising edge and a steep falling edge.

The gate of the transistor M21 is connected to the output terminal /Q via inverters 66 and 63. The gate of the transistor M23 is connected to the output terminal /Q via the inverter 63. The gate of the transistor 25 is connected to the output terminal /Q via an inverter 62. The gates of the three transistors M22, M24 and M26 are connected to the output terminal Q via an inverter 64. Further, the gate of the transistor M27 is connected to the output terminal Q via an inverter 65.

Each of the five inverters 62 to 66 is a CMOS inverter which is composed of a pair of P-channel and N-channel MOS transistors. The inverter 64 is so constructed that the size of the PMOS transistor therefor is larger than that of the NMOS transistor. The inverter 65 is so constructed that the size of the PMOS transistor therefor is smaller than that of the NMOS transistor. In general, as the size of a PMOS transistor for an inverter becomes larger than the size of an NMOS transistor, its inverter has a threshold operating potential closer to an H-level potential. As the size of a PMOS transistor for an inverter becomes smaller than the size of an NMOS transistor, its inverter has a threshold operating potential closer to an L-level potential.

In the DC-DC converter 60, when the TFF 61 produces an L-level signal at the output terminal Q and an H-level signal at the output terminal /Q in response to the clock signal CLK, the three transistors M21, M23 and M25 turn on and the four transistors M22, M24, M26 and M27 turn off.

The first lead of the first capacitor C1 is connected to the power supply $V_{CC}$ via the transistor M23, and the second lead is connected to the ground GND via the transistor M21. As indicated by a chain line, a current flows from the power supply $V_{CC}$ through the transistor M23, capacitor C1, and transistor M21 to the ground GND, to charge up the capacitor C1. As a result, the first lead of the capacitor C1 has the same potential as the power supply $V_{CC}$, and the second lead has the ground level potential (i.e, zero volt). Since the transistor M25 is on, the back gate of the transistor M23 is connected to the power supply $V_{CC}$. As a result, no voltage difference exists between the source and back gate of the transistor M23, so that the resistance value of the transistor M23 when turned on is reduced, resulting in high-speed charging of the first capacitor C1.

When an H-level signal is output from the output terminal Q of the TFF 61 and an L-level signal is output from the output terminal /Q in response to another pulse of the clock signal CLK, the three transistors M21, M23, M25 turn off and the four transistors M22, M24, M26 and M27 turn on.

The second lead of the first capacitor C1 is connected to the power supply $V_{CC}$ via the transistor M22. The first lead of the first capacitor C1 is connected via the transistor M24 to the first lead of the second capacitor C2 and to the output terminal $V_{OUT}$. As indicated by a broken line, a current flows from the power supply $V_{CC}$ to the ground GND through the transistor M22, capacitor C1, transistor M24 and capacitor C2. Accordingly, the first capacitor C1 is discharged, and the second capacitor C2 is charged by charges released from the first capacitor C1. As a result, the first lead of the second capacitor C2 has a potential that is twice as large as the potential of the power supply $V_{CC}$, and the second lead has the ground level potential.

Specifically, when the transistor M23 turns off, the drain voltage $V_D$ of the transistor M23 is raised to the output voltage $V_G$ ($=+2V_{CC}$) by turning on the transistor M24. Then, the back gate voltage $V_D$ of the transistor M23 is raised to the output voltage $V_G$ ($=+2V_{CC}$) by turning on of the transistor M27. Thus, the drain voltage $V_D$ and the back gate voltage $V_{BG}$ is increased to the output voltage $V_G$ approximately at the same time. This prevents a parasitic PNP transistor T3 in the transistor M23, which is composed of the drain region 73 (emitter), the N-type well 72 (base) and the substrate 71 (collector), as shown in FIG. 14, to be turned on, so that no current flows from the output terminal $V_{OUT}$ to the ground GND.

Further, when an H-level signal is output from the output terminal Q of the TFF 61 and an L-level signal is output from the output terminal /Q, the condition of turning off the transistor M23 is satisfied. Then, the transistor M27 turns on first, and thereafter the transistors M24 and M26 turn on, due to the size difference between the inverters 64 and 65. Accordingly, the back gate voltage $V_{BG}$ of the transistor M23 rises to the output voltage $V_G$ ($=+2V_{CC}$) slightly faster than its drain voltage $V_D$. As a result, the back gate voltage $V_{BG}$ and the drain voltage $V_D$ reach the output voltage $V_G$ ($=+2V_{CC}$) such that the former is always higher than the latter.

According to the DC-DC converter 60 of this embodiment, even if the transistors M24 and M26 have a difference in ability, the parasitic bipolar transistor T3 inherently formed in the transistor M23 is positively prevented from being turned on. This reduces the power consumption of the converter 60.

Although only several embodiments of the present invention has been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A DC-DC converter, supplied with power from first and second DC power supplies having different supply voltages, said DC-DC converter comprising:

a first capacitor;

a second capacitor having a lead serving as an output terminal of the DC-DC converter;

first and second MOS transistors for selectively connecting said first capacitor to said first and second DC power supplies so as to charge said first capacitor;

third and fourth MOS transistors for selectively connecting said first capacitor to said second capacitor so as to charge said second capacitor by electric charges stored in said first capacitor, wherein a predetermined output voltage is produced at said output terminal, based on the charge/discharge operations of said first and second capacitors by alternately turning on the first and second MOS transistors' pair and the third and fourth MOS transistors' pair, and wherein a variable voltage is applied to a back gate of one MOS transistor selected from said first to fourth MOS transistors, and constant voltages are applied to back gates of the other three MOS transistors;

a first control transistor for forming a connection between a source and a back gate of said selected MOS transistor; and a second control transistor for applying one of said predetermined output voltage and the supply voltages of said first and second DC power supplies to the back gate of said selected MOS transistor.

2. The DC-DC converter according to claim 1 further comprising a third control transistor, provided between a drain and the back gate of said selected MOS transistor, for performing switching operation in synchronism with the switching of said second control transistor.

3. The DC-DC converter according to claim 2, wherein the back gate of said selected MOS transistor is connected to said output terminal via said second control transistor.

4. The DC-DC converter according to claim 2, wherein the back gate of said selected MOS transistor is grounded via said second control transistor.

5. The DC-DC converter according to claim 1, wherein said first control transistor is a MOS transistor having its source and back gate connected to each other; and wherein said second control transistor is a MOS transistor provided between said output terminal and the back gate of said selected MOS transistor.

6. The DC-DC converter according to claim 1, wherein said first capacitor has first and second leads, said first lead being connectable to said first DC power supply; and wherein said second capacitor has a first lead connected to said second DC power supply and a second lead serving as said output terminal.

7. The DC-DC converter according to claim 6,
wherein said first MOS transistor is provided between the first lead of said first capacitor and said first DC power supply;
wherein said second MOS transistor is provided between the second lead of said first capacitor and said second DC power supply;
wherein said third MOS transistor is provided between the first lead of said first capacitor and the first lead of said second capacitor; and
wherein said fourth MOS transistor is provided between the second lead of said first capacitor and the second lead of said second capacitor,
whereby when said first and second MOS transistors are on and said third and fourth MOS transistors are off, the first lead of said first capacitor is connected to said first DC power supply and the second lead of said first capacitor is connected to said second DC power supply, so that said first capacitor is charged, and
whereby when said first and second MOS transistors are off and said third and fourth MOS transistors are on, the first lead of said first capacitor is connected to the first lead of said second capacitor, so that said second capacitor is charged by electric charges released from said first capacitor.

8. The DC-DC converter according to claim 7, wherein said selected MOS transistor is the second MOS transistor M3.

9. The DC-DC converter according to claim 7, wherein when said selected MOS transistor is off, said second control transistor turns on, prior to the turning on of said fourth MOS transistor.

10. The DC-DC converter according to claim 1,
wherein said first capacitor has first and second leads, said first lead being connectable to said first DC power supply; and
wherein said second capacitor has a first lead serving as said output terminal and a second lead connected to said second DC power supply.

11. The DC-DC converter according to claim 10,
wherein said first MOS transistor is provided between the first lead of said first capacitor and said first DC power supply;
wherein said second MOS transistor is provided between the second lead of said first capacitor and said second DC power supply;
wherein said third MOS transistor is provided between the first lead of said first capacitor and the first lead of said second capacitor; and
wherein said fourth MOS transistor is provided between the second lead of said first capacitor and said first DC power supply,
whereby when said first and second MOS transistors are on and said third and fourth MOS transistors are off, the first lead of said first capacitor is connected to said first DC power supply and the second lead of said first capacitor is connected to said second DC power supply, so that said first capacitor is charged, and
whereby when said first and second MOS transistors are off and said third and fourth MOS transistors are on, the first lead of said first capacitor is connected to the first lead of said second capacitor, so that said second capacitor is charged by electric charges released from said first capacitor.

12. The DC-DC converter according to claim 11, wherein said selected MOS transistor is the fourth MOS transistor M14.

13. The DC-DC converter according to claim 11, wherein said selected MOS transistor is the first MOS transistor M23.

14. The DC-DC converter according to claim 1,
wherein said first control transistor is a MOS transistor having its drain and back gate connected to each other; and
wherein said second control transistor is a MOS transistor provided between said second DC power supply and the back gate of said selected MOS transistor.

15. The DC-DC converter according to claim 1, wherein the supply voltage of said second DC power supply is equal to a ground level potential, and the supply voltage of said first DC power supply is higher than the ground level potential.

* * * * *